(12) United States Patent
Lee et al.

(10) Patent No.: US 7,105,908 B2
(45) Date of Patent: Sep. 12, 2006

(54) SRAM CELL HAVING STEPPED BOUNDARY REGIONS AND METHODS OF FABRICATION

(75) Inventors: Wen-Chin Lee, Hsin-Chu (TW); Yee-Chia Yeo, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/852,324

(22) Filed: May 24, 2004

(65) Prior Publication Data

US 2005/0051867 A1 Mar. 10, 2005

Related U.S. Application Data

(60) Provisional application No. 60/500,426, filed on Sep. 5, 2003.

(51) Int. Cl.
*H01L 29/00* (2006.01)
(52) U.S. Cl. ............... 257/510; 257/511; 257/514; 257/515
(58) Field of Classification Search ........... 257/510, 257/506, 501, 505, 515, 511, 514
See application file for complete search history.

(56) References Cited

U.S. PATENT DOCUMENTS 6,461,887 B1 * 10/2002 Pradeep et al. ............. 438/43
6,670,279 B1   12/2003 Pai et al.
2004/0217448 A1 * 11/2004 Kumagai et al. ........... 257/627
2005/0156158 A1 *  7/2005 King .......................... 257/20

OTHER PUBLICATIONS

Conley, J.F., et al., "Preliminary Investigation of Hafnium Oxide Deposited via Atomic Layer Chemical Vapor Deposition (ALCVD)," 2001 IRW Final Report (2001), pp. 11-15.
Oh, C.B., et al., "Manufacturable Embedded CMOS 6T-SRAM Technology with High-k Gate Dielectric Device for System-on-Chip Applications," International Electron Devices Meeting (2002) pp. 423-426.
Samavedam, S.B., et al., "Dual-Metal Gate CMOS with HfO$_2$ Gate Dielectric," International Electron Device Meeting (2002) pp. 433-436.

* cited by examiner

*Primary Examiner*—MinhLoan Tran
*Assistant Examiner*—Tan Tran
(74) *Attorney, Agent, or Firm*—Slater & Matsil, L.L.P.

(57) ABSTRACT

A semiconductor device comprises a substrate. In addition, the semiconductor device comprises an active region and an isolation region. The active region is in the substrate and comprises a semiconductor material. The isolation region is also in the substrate, adjacent the active region and comprises an insulating material. The active region and isolation region form a surface having a step therein. The semiconductor further comprises a dielectric material formed over the step. The dielectric material has a dielectric constant greater than about 8.

27 Claims, 10 Drawing Sheets

SRAM CELL HAVING STEPPED BOUNDARY REGIONS AND METHODS OF FABRICATION

This application claims the benefit of U.S. Provisional Application No. 60/500,426, filed on Sep. 5, 2003, entitled "Novel SRAM Cell and Methods of Fabrication", which application is hereby incorporated herein by reference.

TECHNICAL FIELD

The present invention relates generally to semiconductor devices, and more particularly to a static random access memory (SRAM) cell and methods of fabrication.

BACKGROUND

Electronic devices including mobile and portable devices such as cell phones, personal digital assistants (PDA), digital cameras, and combinations thereof, require static random access memory (SRAM) chips with low standby power and low operating power consumption. An SRAM chip may comprise millions of SRAM cells similar to the 6T SRAM cell 100 shown in FIG. 1a. Other types of SRAM cells include four transistor (4T) SRAM cells and single transistor (1T) SRAM cells, for example. Shallow trench isolation (STI) structures are commonly used to define the active areas of and to electrically isolate SRAM cells.

However, undesired recesses known as divots may form directly adjacent transistor active areas in shallow trench isolation structures during the STI manufacturing process. The conventional STI process flow includes pad oxide and silicon nitride (SiN) deposition, active area masking, nitride/oxide etching, silicon (Si) trench etching, liner oxidation, chemical vapor deposition (CVD) oxide filling, chemical mechanical polishing (CMP), and nitride and pad oxide removal. Well known issues in conventional STI processes include divot formation (i.e., oxide recess, or FOX recesses) along STI edges. The divot at the edge of the STI is formed due to the wet dip of the pad oxide and/or sacrificial oxide by a hydrofluoric acid (HF) solution.

FIG. 1b is an overhead view of the 6T SRAM cell 100 of FIG. 1a, showing transistor gate stacks 102 crossing over divots 104 formed along the boundary 106 between active areas 108 and shallow trench isolation (STI) regions 110.

FIG. 1c is a cross-sectional view of the N2 transistor in the 6T SRAM cell 100 corresponding to the reference line X in FIG. 1b. FIG. 1c shows the gate dielectric 112 and gate electrode 114 deposited with a conformity greater than about 75%. If we do not use the word conformably deposited over divots 104. STI corners 116 in the active region 108 of the N2 transistor experience undesired current leakage. Because the gate dielectric 112 does not completely fill the divots 104, the divots 104 also comprise a portion of the gate electrode 114. The undesired extension of the gate dielectric 112 and gate electrode 114 along the sidewalls of the STI corners 116 may be a source of current leakage. Particularly, the non-planar shape of the gate dielectric 112 and gate electrode 114 at the STI corners 116 produces a concentrated electromagnetic field, thus causing STI corner current leakage. Additionally, the gate dielectric 112 experiences material stress over steps 118 in the divots 104, which may have an undesired effect on transistor power consumption.

SUMMARY OF THE INVENTION

These and other problems are generally solved or circumvented, and technical advantages are generally achieved, by illustrative embodiments of the present invention, which provide an SRAM cell and methods of fabrication.

In one aspect, the invention provides for a semiconductor device comprising a substrate. An active region in the substrate comprises a semiconductor material, and an isolation region in the substrate adjacent the active region comprises an insulating material. The active region and isolation region form a surface having a step therein and a dielectric material is formed over the step, the dielectric material having a dielectric constant greater than about 8.

In another aspect, the invention provides for a memory cell comprising an active region having at least one transistor formed therein. The memory cell also comprises an isolation region adjacent the active region, and a boundary region having a first step. The boundary region is intermediate the active region and the isolation region. The memory cell further comprises a gate dielectric extended over the first step, the gate dielectric comprising a material with a dielectric constant above about 8.

In yet another aspect, the invention provides for a memory cell comprising a transistor in an active region, the active region comprising a material selected from the group consisting of silicon, germanium, carbon, and combinations thereof. The memory cell also comprises an isolation region adjacent the active region, the isolation region comprising a material selected from the group consisting of silicon nitride, silicon oxide, silicon oxynitride, and combinations thereof. The isolation region further comprises an isolation structure selected from the group consisting of shallow trench isolation structure, mesa isolation structure, local oxidation of silicon isolation structure, and a combination thereof. The memory cell further comprises a first step, a second step, and a third step. The first step is intermediate the active region and the isolation region, the first step having a first step height of about 400 angstroms. The second step is formed in the active region, the second step having a step height less than about 5000 angstroms. The third step is formed in the isolation region, the third step having a step height less than about 500 angstroms. The memory cell further comprises a gate dielectric overlying the first step, the second step, and the third step. The gate dielectric comprises a material with a relative permittivity above about 8, and the material overlying the first, second and third steps has a conformity above about 75%.

In yet another aspect, the invention provides for a method of forming an SRAM cell. The method comprises the step of forming an isolation trench in a substrate. The isolation region defines an active region. The method also comprises the step of over-filling the isolation trench with a dielectric material and removing some of the dielectric material, the removing step forming a divot in the remaining dielectric material. The method further comprises forming a transistor in the active region. The transistor includes a gate dielectric that extends over and at least partially fills the divot, the gate dielectric having a relative permittivity greater than about 8. The method still further comprises the steps of forming a gate electrode over the gate dielectric and forming a silicide in the gate electrode.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1A:
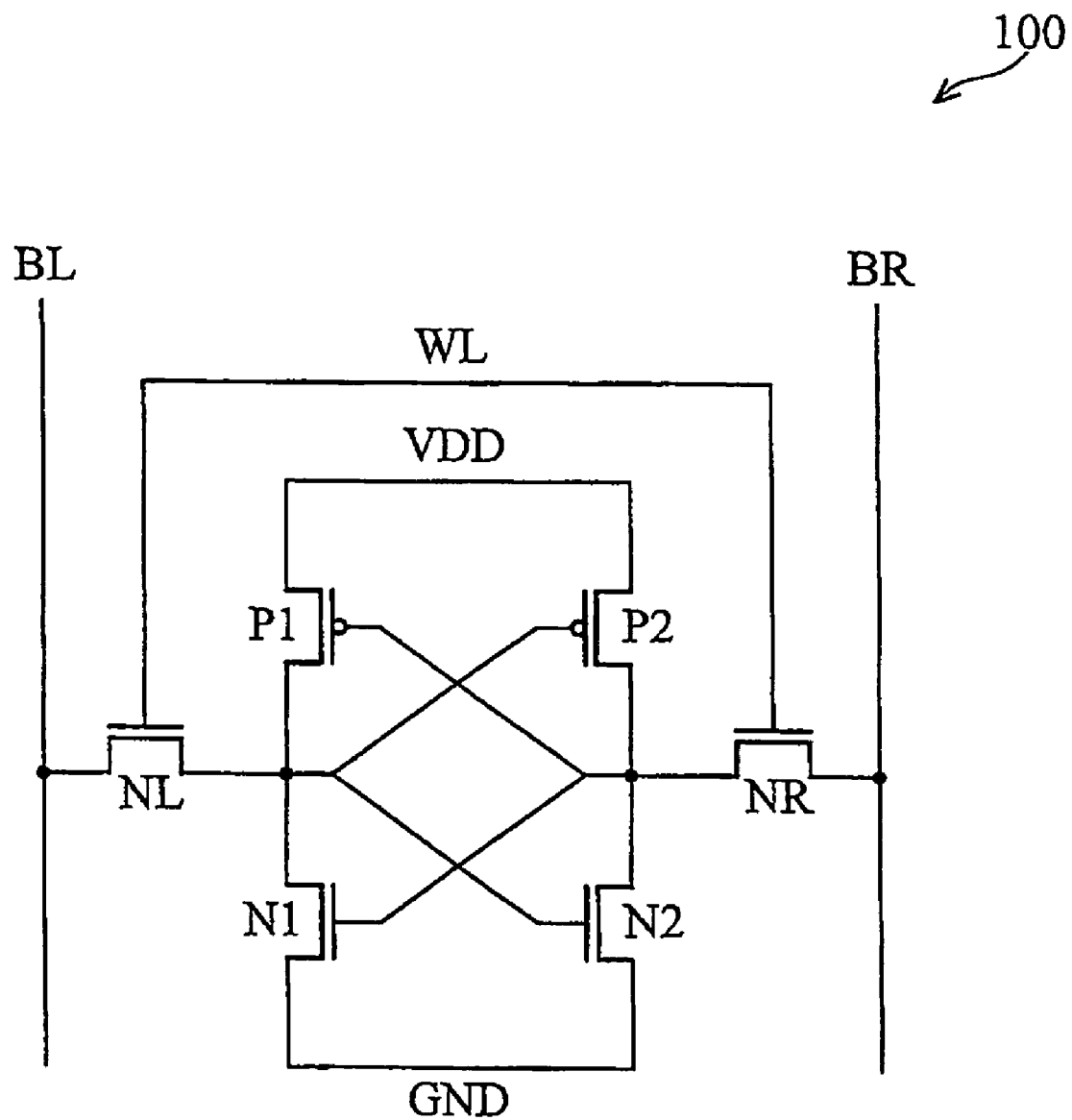
FIG. 1a is a schematic view of a six transistor static random access memory (6T SRAM) cell.
Figure 1B:
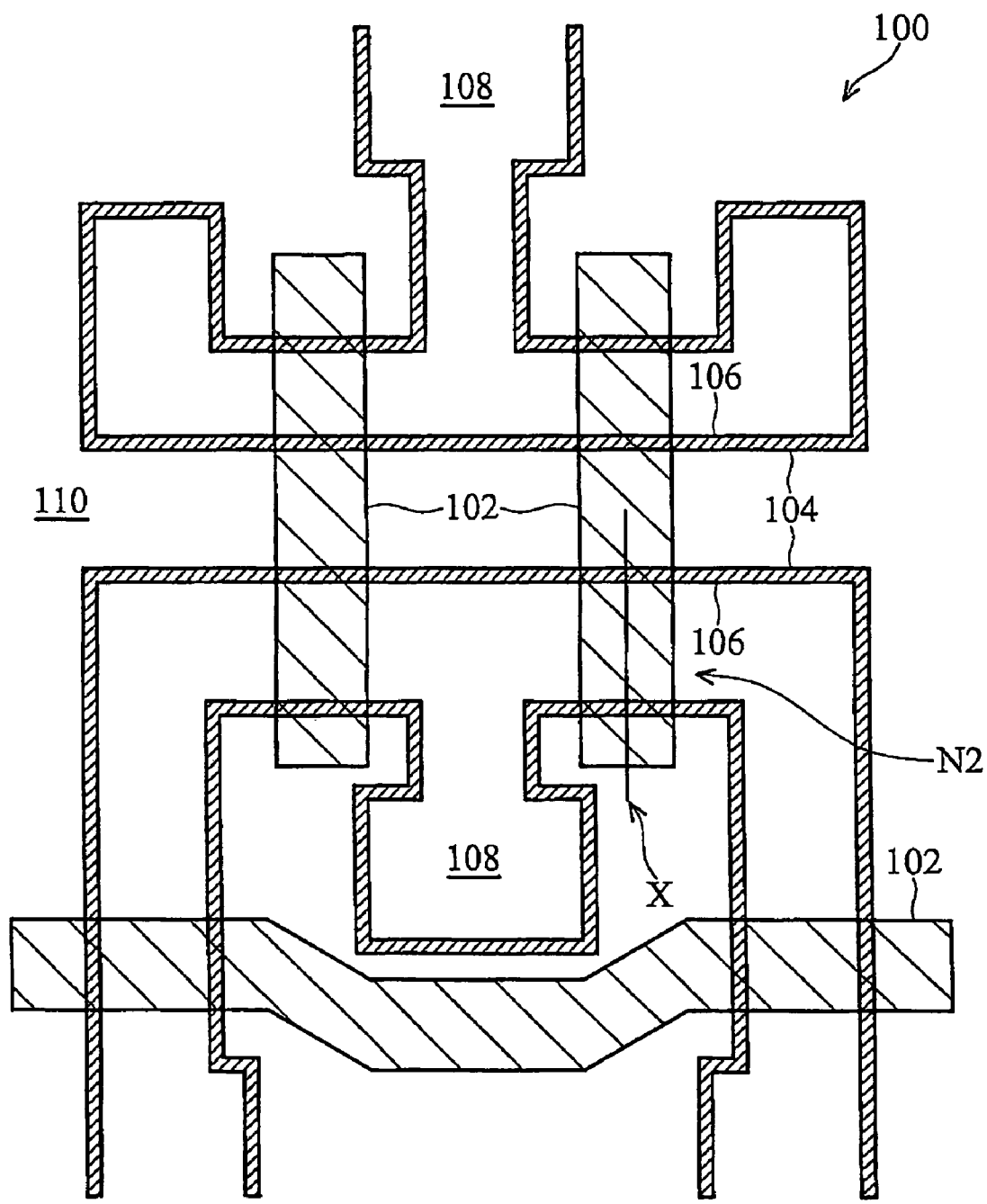
FIG. 1b is a layout view of the 6T SRAM cell of FIG. 1a, showing only selected layers.
Figure 1C:
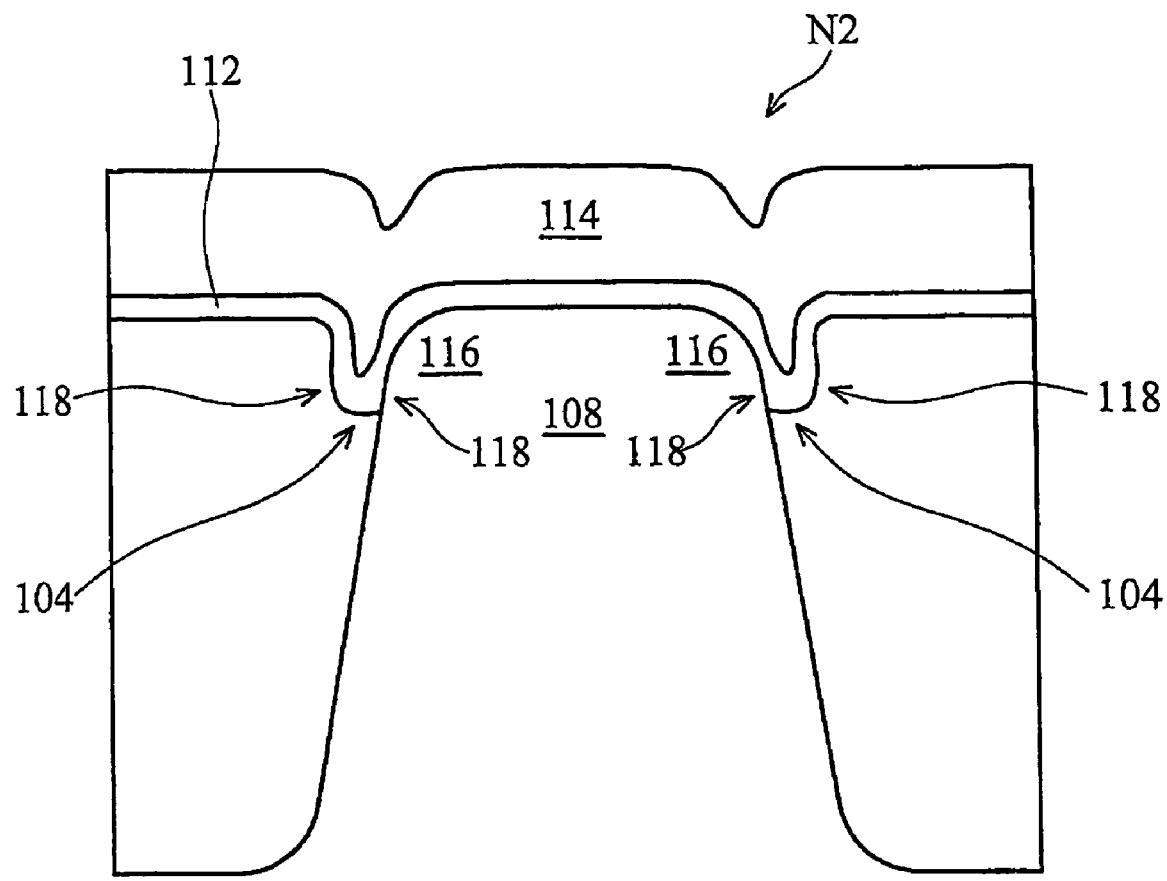
FIG. 1c is a cross-sectional view of a transistor from the 6T SRAM cell of FIG. 1b.

The making and using of the presently illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 2a–2e are cross-sections illustrating a method of manufacturing in accordance with a first illustrative embodiment of the present invention. The method includes the semiconductor substrate 200 shown in FIG. 2a. The semiconductor substrate 200 includes shallow trench isolation (STI) structures 202 in bulk p-type silicon 203, directly adjacent the active region 204. The STI structures 202 have divots 206 directly adjacent corners 208 of the active region 204. The divots 206 have steps 205 with a bottom surface 207 of silicon dioxide and a top surface 209 of a silicon material. For clarity, the divots 206 are shown in an exaggerated scale.

Figure 2A:
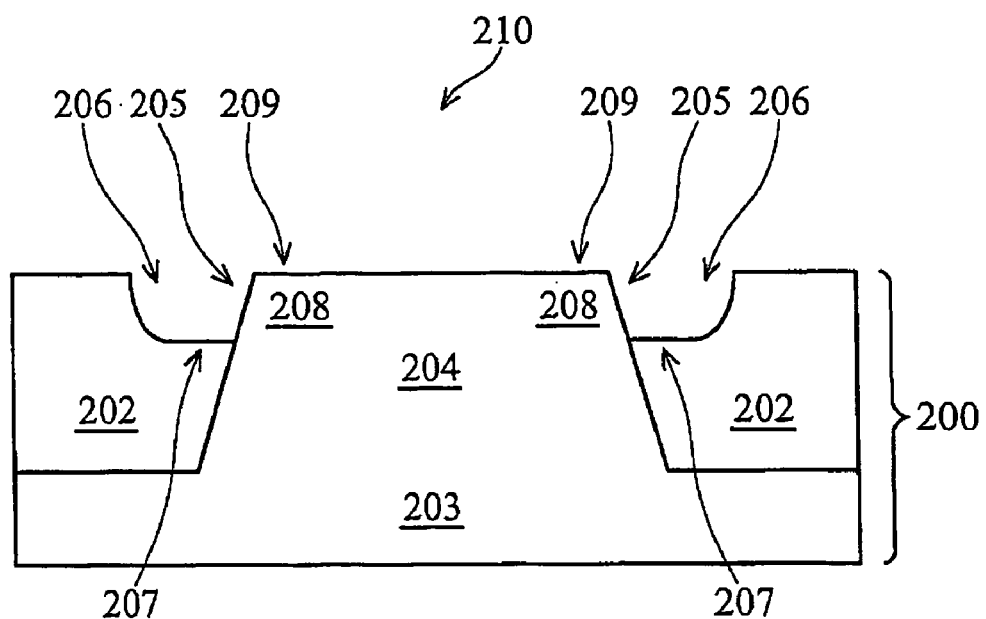
FIGS. 2a–2e are cross-sectional views illustrating a method of manufacturing the present invention in accordance with a first illustrative embodiment.
Figure 2B:
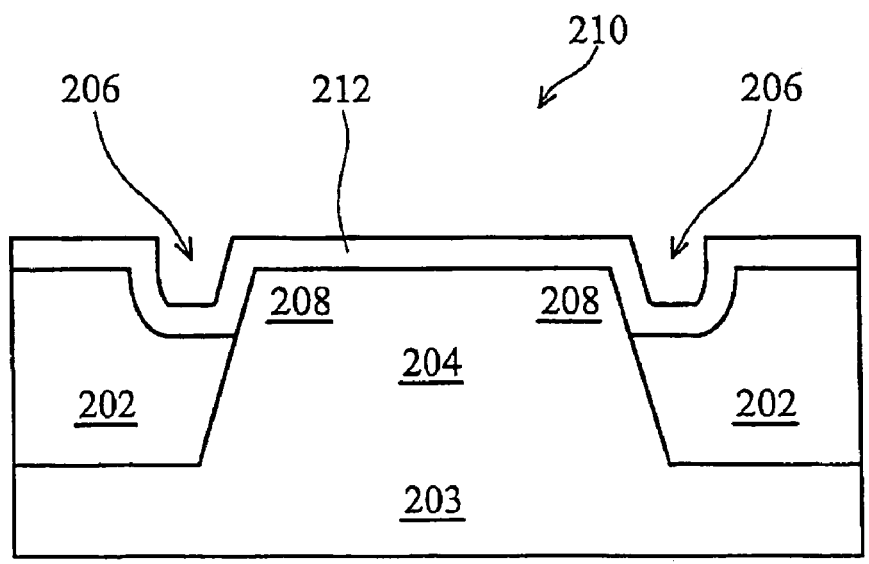
Figure 2C:
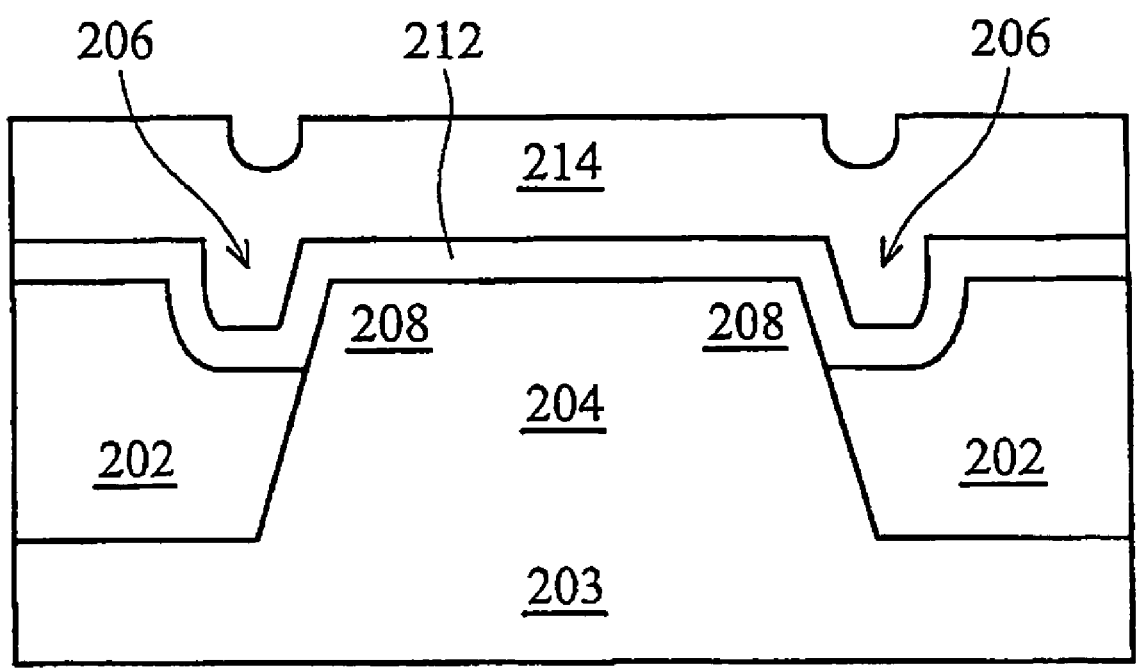

After the formation of the STI structure 202, the substrate surface 210 is cleaned by nitridation using nitrogen gas ($N_2$). However, other methods of cleaning the substrate surface 210 in preparation for the high k thin layer deposition include the use of other nitrogen gases including nitrous oxide ($N_2O$), nitric oxide (NO), and ammonia ($NH_3$), for example. A high k layer of hafnium oxide ($HfO_2$) 212 with a dielectric constant greater than about 8, is deposited with a conformity greater than about 75% by atomic layer chemical vapor deposition (ALCVD) over the substrate surface 210, as shown in FIG. 2b. As is known in the art, conformity is used to define step coverage of a layer on the sidewall of a step, and can be expressed as a ratio of the thickness of the layer on the sidewall of the step to a thickness of the same layer on a horizontal surface. Details regarding the ALCVD process maybe found in a paper by Conley et al. entitled "Preliminary Investigation of Hafnium Oxide Deposited via ALCVD," Proc. IRW Final Report, pp.11–15, 2001, which is incorporated herein by reference. In addition to deposition by ALCVD, other illustrative embodiments include high k thin film deposition processes such as metal organic chemical vapor deposition (MOCVD), sub atmosphere chemical vapor deposition (SACVD), and rapid thermal chemical vapor deposition (RTCVD). Still other illustrative embodiments include remote plasma enhanced chemical vapor deposition (RPECVD), low pressure chemical vapor deposition (LPCVD), high density plasma chemical vapor deposition (HDP CVD), and various physical vapor deposition (PVD) processes including evaporation and sputtering.

It should be noted that materials having a relative permittivity or dielectric constant (k) greater than the dielectric constant of silicon dioxide (k=3.9) are commonly referred to as high k dielectric materials. However, high k dielectric materials in illustrative embodiments of the present invention preferably have a dielectric constant greater than about 8.

During the ALCVD deposition described above, the $HfO_2$ gate dielectric material is deposited over the substrate surface with a conformity greater than about 75%. The conformity of the gate dielectric is usually tuned through deposition pressure, temperature and gas flow, for example. Variations in these and other process conditions may vary the conformity of the gate dielectric.

A layer of polysilicon 214 is deposited over the hafnium oxide 212. Illustrative embodiments of the present invention include forming any material suitable for gate electrode formation over the high k layer 212. Gate electrode materials in other illustrative embodiments include platinum (Pt), tantalum nitride (TaN), titanium nitride (TiN), aluminum, and tungsten for example.

Figure 2D:
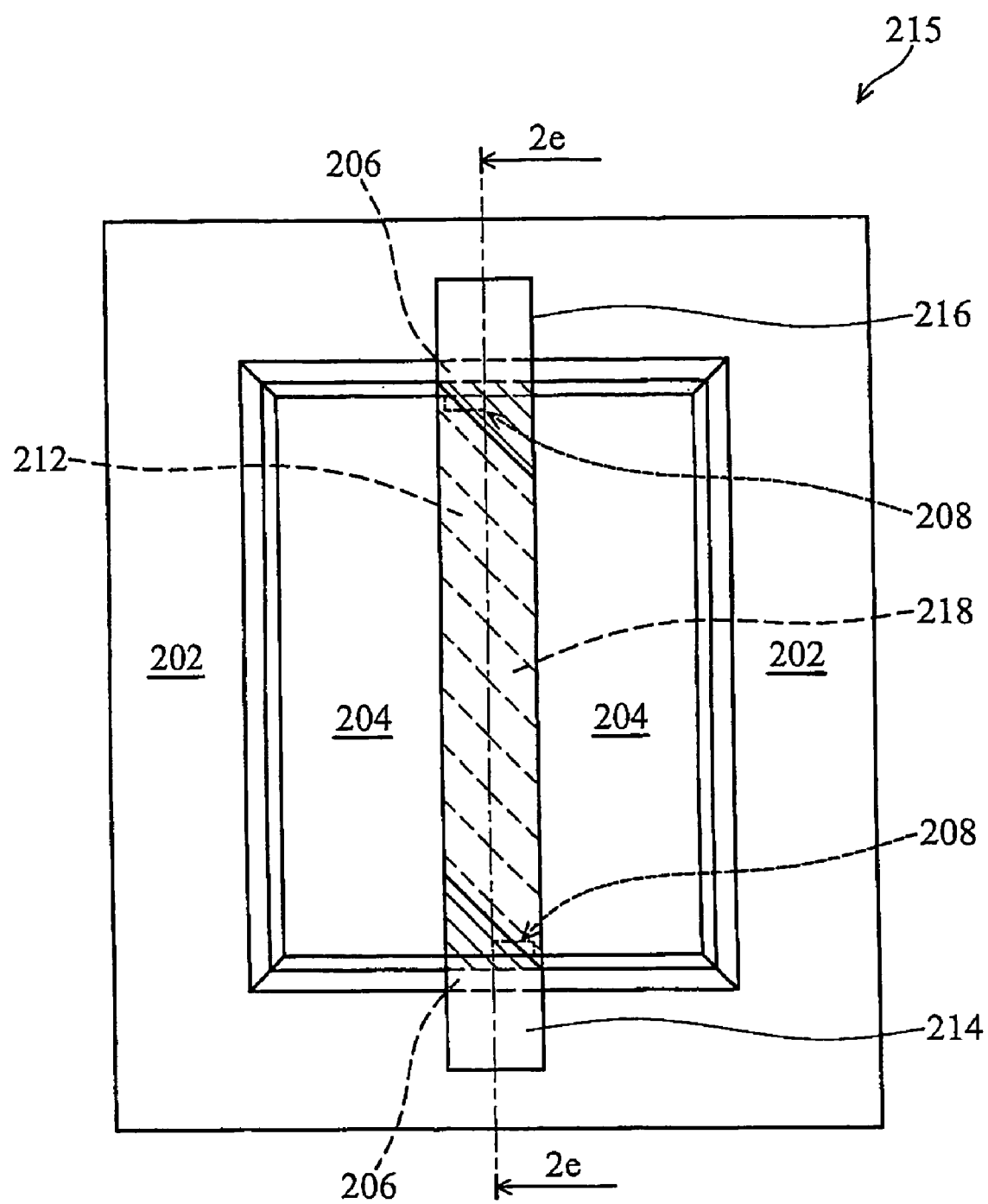
Figure 2E:
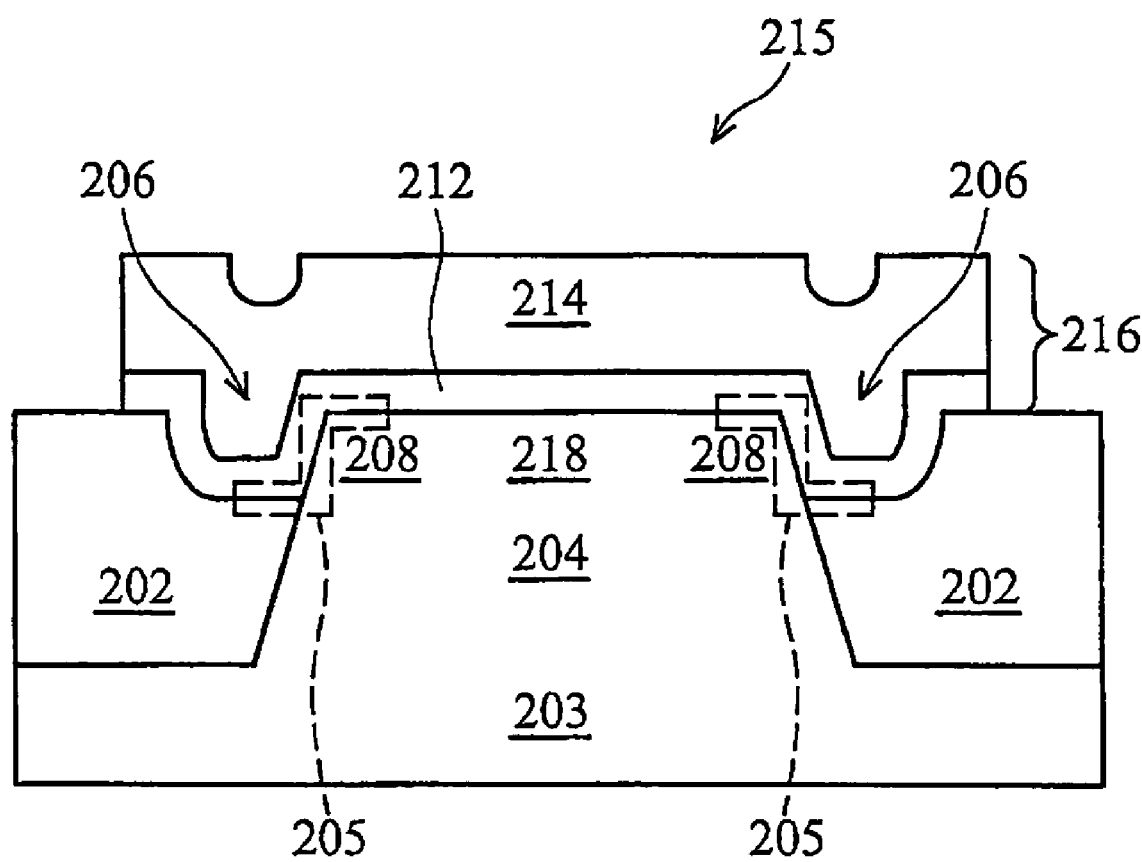

A selective etch removes portions of the high k gate dielectric layer 212 and the overlying gate electrode 214 layer. FIG. 2d is a layout view the first illustrative embodiment after the selective etch step. FIG. 2e shows a cross-section of FIG. 2d along line 2e—2e. The hafnium oxide layer 212 and gate electrode layer 214 form a gate stack 216 over the transistor channel 218. Subsequent manufacturing steps, including ion implantation, for example, form a transistor 215. Further metallization steps form a 6T SRAM cell on an SRAM chip.

The 6T SRAM cell of the first illustrative embodiment has six transistors, all of which have a high k gate dielectric. However, in other illustrative embodiments, only portions of the transistors in the 6T SRAM cell have high k gate dielectrics. For example, high k gate dielectric materials may be limited to the p-type transistors in the 6T SRAM cell, or limited to the n-type transistors in the 6T SRAM cell.

The transistor 215 in the SRAM cell of the first illustrative embodiment is preferably a metal oxide semiconductor field effect transistors (MOSFETs). Alternatively, the transistor 215 may be another type of transistor such as a strained channel transistor, for example. The strained channel transistor may comprise silicon, carbon, germanium, and combinations thereof, for example.

The substrate 203 of the first illustrative embodiment includes a bulk silicon substrate. Substrates in other illustrative embodiments of the present invention further include silicon on insulator (SOI) substrates, strained silicon on insulator (SSOI) substrates and strained silicon over relaxed silicon germanium substrates. The relaxed silicon germanium may include a graded silicon germanium layer, for example.

The dielectric material in the shallow trench isolation structures 202 in the transistor 215 is silicon dioxide ($SiO_2$). In other illustrative embodiments of the present invention, materials used in the isolation structures of SRAM cells include silicon nitride ($Si_3N_4$), silicon oxynitride (SiON), boron nitride (BN), and silicon (Si), for example. In some illustrative embodiments of the present invention, the high k gate dielectric material is also a part of the transistor isolation structure, such as in a local oxidation of silicon isolation structure. In other embodiments, the high k material is the pad oxide and used as a liner in shallow trench isolation structures. In still other embodiments, the isolation material is formed in the recesses of mesa isolation structures.

Steps 205, highlighted by dotted lines in FIG. 2e, are in the divots 206 of the STI structures 202. The steps 205 are formed in an etching process related to the STI manufacturing process. In other illustrative embodiments of the present invention, steps in the substrate may be formed by a selective etch. The selective etch may further comprise a masking step, however, the invention is not so limited. The selective etch may be isotropic or anisotropic. If the selective etch is an anisotropic etch, it may be any type of dry etch. If the selective etch is an isotropic etch, it may be a chemical dry etch or a wet etch. A selective wet etch used to form a step in an illustrative embodiment of the present invention may comprise an etchant with a etch rate (ER) that etches faster on selected regions, e.g., isolation regions. The etchant may comprise hydrofluoric acid (HF), phosphoric acid ($H_3PO_4$), or combinations thereof, for example. Other embodiments of the present invention require a backside clean step after the wet etch step. However, the backside clean step is not required for the manufacturing of all embodiments.

The steps 205 in the divots 206 have a bottom surface of silicon dioxide and a top surface of silicon. The illustrative embodiments shown in FIGS. 3a–3f and described below use various types of steps with various top surfaces, bottom surfaces, and overlying high k gate dielectric layers.

Figure 3A:
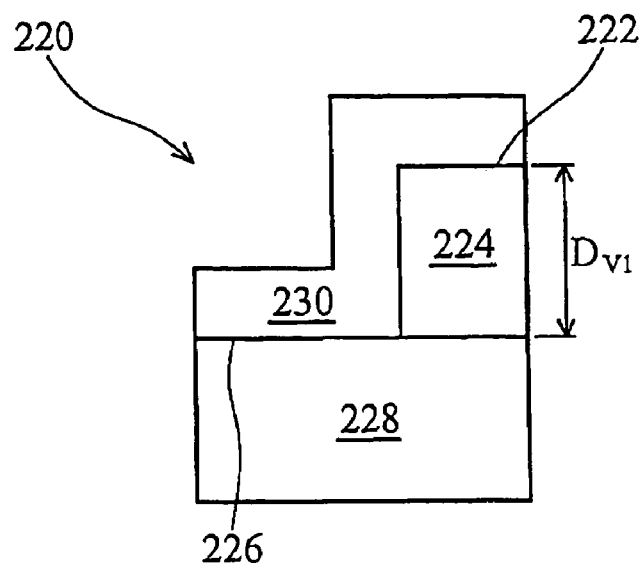
FIGS. 3a–3f are cross-sectional views of a step in illustrative embodiments of the present invention.

The illustrative embodiment in FIG. 3a shows a step 220 formed, for example, at an STI boundary of an SOI transistor with mesa isolation. The step 220 has a vertical distance $D_{v1}$ of between about 5 to about 500 angstroms. The top surface 222 of the step is silicon 224 and the bottom surface 226 of the step 220 is silicon oxide 228. A layer of hafnium oxide ($HfO_2$) 230 formed over the step has a step coverage greater than about 75%.

Figure 3B:
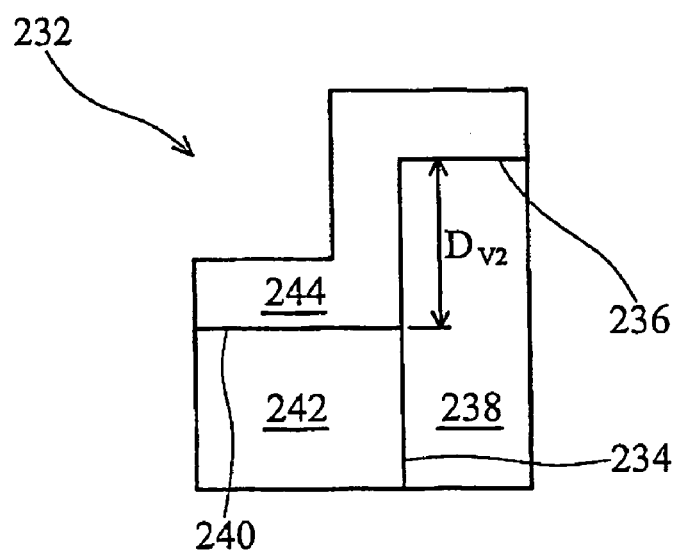

The illustrative embodiment in FIG. 3b shows a step 232, for example, in an STI divot of a 6T SRAM cell transistor. The step 232 includes the boundary 234 of an insulating material 242 and a semiconductor material 238. The top surface 236 of the step 232 is silicon 238. The top surface 236 is vertically separated ($D_{v2}$) from the bottom surface 240 by about 200 angstroms. The bottom surface 240 of the step 232 is silicon oxide 242. The high k layer of hafnium oxide 244 is more than 75% conformal to the step 232.

Figure 3C:
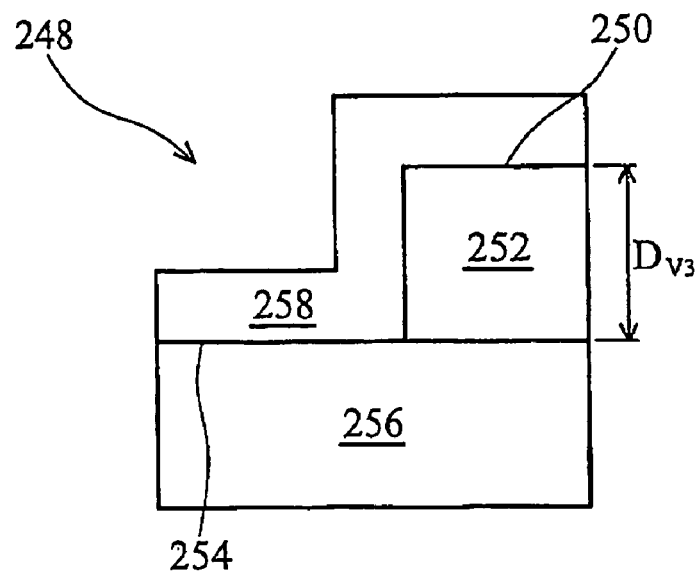

FIG. 3c shows a step 248, for example, in a 1T SRAM cell transistor. The top surface 250 of the step 248 is silicon oxide 252 and the bottom surface 254 of the step 248 is silicon 256. The step height $D_{v3}$ is about between 5 to 100 angstroms. Hafnium oxide 258 formed over the step 248, is more than 75% conformal to the step 248.

Figure 3D:
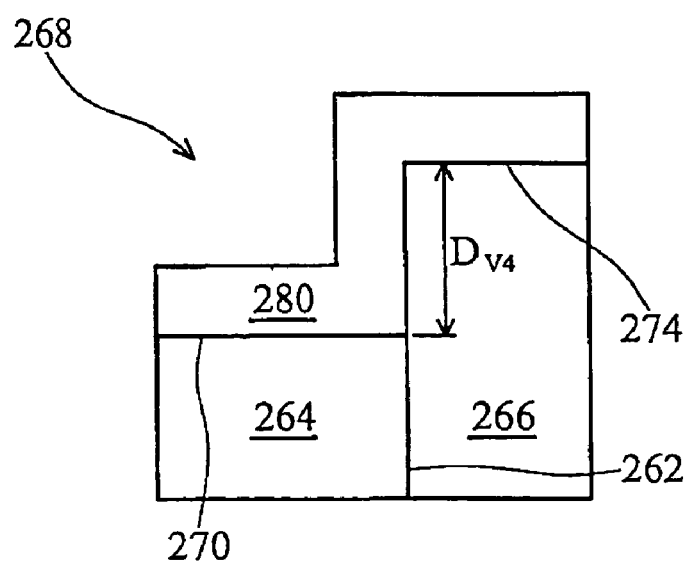

In FIG. 3d, the boundary 262 between the active region 264 and the shallow trench isolation (STI) region 266, of an SRAM cell transistor for example, has a step 268. The bottom surface 270 of the step is the surface of the active region 264 comprising a compound of silicon, carbon and germanium. The top surface 274 of the step 268 is the top surface of the STI region 266 comprising silicon dioxide. The step height $D_{v4}$ is about 400 angstroms. A high k gate dielectric layer of hafnium oxide 280 formed over the step 268 has step coverage greater than about 75%.

Figure 3E:
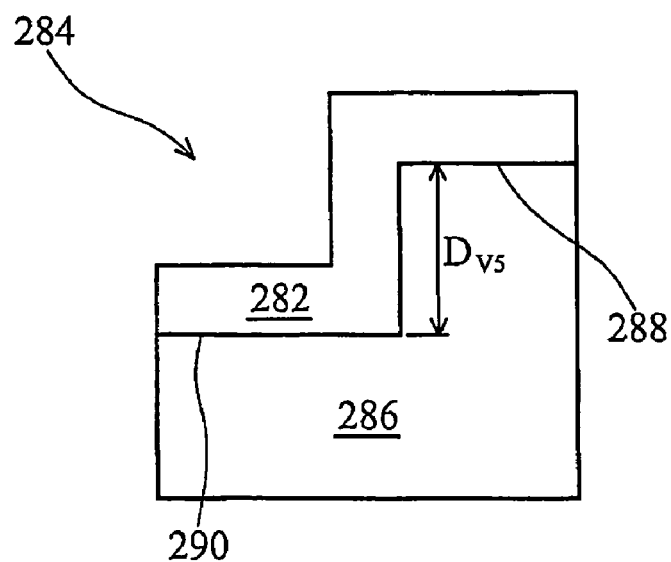

In figure 3e, a gate dielectric material of hafnium oxynitride 282 is formed over a step 284 with a conformity greater than about 75% and in an isolation region 286 of a 6T SRAM cell. The top surface 288 and the bottom surface 290 of the step 284 are surfaces of the silicon oxide 286. The top surface 288 has a vertical distance $D_{v5}$, of about 400 angstroms from the bottom surface 290. The step 284 in FIG. 3e has top 288 and bottom 290 surfaces comprising the same dielectric material, however, in other embodiments having a step in an isolation region, the top and bottom steps may comprise different dielectric materials.

Figure 3F:
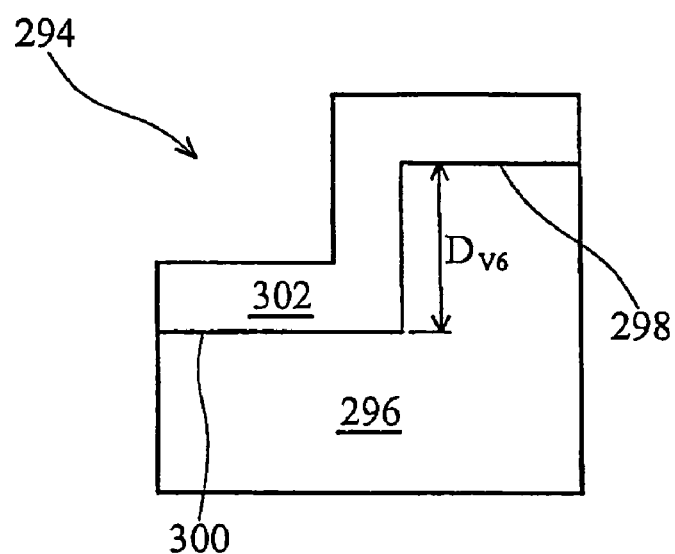

A portion of a 6T SRAM cell transistor shown in FIG. 3f has a step 294 in an active region 296. The step 294 has a top surface 298 and bottom surface 300 of the same material. The top surface 298 and bottom surface 300 of the step 294 are active region surfaces comprising silicon 296. The top surface 298 has a vertical distance $D_{v6}$ of about 5000 angstroms from the bottom surface 300. A high k gate dielectric layer of hafnium silicate 302 formed over the step 294 by atomic layer deposition (ALD) has a dielectric constant greater than about 8. In other illustrative embodiments having steps with top and bottom surfaces in an active region, the top and bottom steps are different materials.

The illustrative embodiments described above have several advantages. The high k dielectric material (k>8) enables better control of the STI corner current leakage in SRAM cell transistors, providing lower standby current and lower power consumption. By providing a gate dielectric with a dielectric constant greater than 8, a thicker gate dielectric may be used in SRAM cell transistors while maintaining the required capacitance between the gate electrode and the underlying transistor channel. A thick layer of high k material minimizes the tunneling current and the out-diffusion of ion implanted dopants from the gate.

Steps in illustrative embodiments of the present invention have various step heights. Steps that have a vertical distance less than about 400 angstroms, have a top surface of insulating material and a bottom surface of semiconductor material. Other illustrative embodiments of the present invention include steps with a top surface of semiconductor material and a bottom surface of insulating material. In such embodiments, the step height is preferably less than about 200 angstroms. Steps with a vertical distance less than 500 angstroms preferably have a top and a bottom surface of dielectric material. Steps with a top and a bottom surface of semiconductor material have a vertical distance less than about 5000 angstroms.

Illustrative embodiments include high k gate dielectric materials that preferably comprise hafnium and zirconium, including zirconium oxide, hafnium oxynitride, and hafnium silicate, for example. Other illustrative embodiments include aluminum oxide, and lanthanum oxide, for example. Illustrative embodiments include the use of combinations of the above mentioned gate dielectric materials, including multi-layered heterogeneous gate dielectrics and gate dielectric alloys comprising zirconium, hafnium, oxygen, nitrogen, lanthanum, and aluminum, for example. Illustrative embodiments of the present invention also include multi-layer gate dielectrics comprising high k dielectric layers and dielectric layers having a dielectric constant lower than about 8.

Although the present invention and its advantages have been described in detail, it should be understood that various changes, substitutions and alterations can be made herein without departing from the spirit and scope of the invention as defined by the appended claims. As another example, it will be readily understood by those skilled in the art that an SRAM cell may be varied while remaining within the scope of the present invention. Furthermore, the structure and method of manufacturing a high k dielectric material with a permittivity higher than about 8 may be embodied in any semiconductor device and is not limited to steps in a 6T SRAM cell.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   an active region in the substrate, the active region comprising a semiconductor material;
   an isolation region in the substrate, adjacent the active region and comprising an insulating material, a top surface of the active region and a top surface of the isolation region forming a surface having a step therein; and
   a dielectric material formed over the step, the dielectric material having a dielectric constant greater than about 8.

2. The semiconductor device of claim 1 wherein the dielectric material is formed over the step with a conformity of greater than about 75%.

3. The semiconductor device of claim 1 wherein the step is intermediate the active region and the isolation region.

4. The semiconductor device of claim 1 wherein a top surface of the step is the top surface of the active region and a bottom surface of the step is the top surface of the isolation region.

5. The semiconductor device of claim 4 wherein the top surface and the bottom surface have a vertical separation in the range of about 5 angstroms to about 500 angstroms.

6. The semiconductor device of claim 4 wherein the top surface and the bottom surface have a vertical separation less than about 600 angstroms.

7. The semiconductor device of claim 1 wherein a top surface of the step is the top surface of the isolation region and a bottom surface of the step is the top surface of the active region.

8. The semiconductor device of claim 7 wherein the top surface and the bottom surface have a vertical separation in the range of about 5 to about 600 angstroms.

9. The semiconductor device of claim 1 wherein a top surface of the step and a bottom surface of the step are respective surfaces of the active region.

10. The semiconductor device of claim 9 wherein the top surface and the bottom surface have a vertical separation in the range of about 5 to about 5000 angstroms.

11. The semiconductor device of claim 1 wherein the active region comprises a material selected from the group consisting essentially of silicon (Si), germanium (Ge), carbon (C), and combinations thereof.

12. The semiconductor device of claim 1 wherein a top surface and a bottom surface are respective surfaces of the isolation region.

13. The semiconductor device of claim 12 wherein the top surface of the step and the bottom surface of the step have a vertical separation in the range of about 5 to about 600 angstroms.

14. The semiconductor device of claim 1 wherein the isolation region comprises a material selected from the group consisting essentially of silicon oxide, silicon nitride, silicon oxynitride, boron nitride, and combinations thereof.

15. The semiconductor device of claim 1 wherein the isolation region comprises a shallow trench isolation structure.

16. The semiconductor device of claim 1 wherein the dielectric material is selected from the group consisting of aluminum oxide, hafnium oxide, zirconium oxide, lanthanum oxide, hafnium oxynitride, hafnium silicate, and combinations thereof.

17. The semiconductor device of claim 1 wherein the substrate is selected from the group consisting of silicon on insulator substrate, strained silicon on insulator substrate, relaxed silicon germanium substrate, and combinations thereof.

18. The semiconductor device of claim 1 wherein the dielectric material overlies a portion of the active region to form a transistor gate dielectric.

19. A memory cell comprising:
    an active region having at least one transistor formed therein;
    an isolation region adjacent the active region;
    a boundary region having a first step between a top surface of the isolation region and a top surface of the active region, the boundary region being intermediate the active region and the isolation region; and
    a gate dielectric extending over the first step, the gate dielectric comprising a material with a dielectric constant above about 8.

20. The memory cell of claim 19 wherein the memory cell comprises an SRAM cell.

21. The memory cell of claim 19 wherein the first step has a step height less than about 600 angstroms.

22. The memory cell of claim 19 wherein the active region comprises a material selected from the group consisting of silicon, germanium, carbon, and combinations thereof.

23. The memory cell of claim 19 wherein the isolation region comprises a material selected from the group consisting of silicon nitride, silicon oxide, silicon oxynitride, and combinations thereof.

24. The memory cell of claim 19 wherein the isolation region comprises an isolation structure selected from the group consisting of shallow trench isolation structure, mesa isolation structure, local oxidation of silicon structure, and combinations thereof.

25. The memory cell of claim 19 wherein the active region further comprises a second step, the second step height having a height less than about 5000 angstroms, and the gate dielectric formed over the second step with a conformity above about 75%.

26. The memory cell of claim 19 wherein the isolation region comprises a second step, the second step having a height less than about 600 angstroms, and the gate dielectric formed over the second step with a conformity above about 75%.

27. The memory cell of claim 19 wherein the gate dielectric covers the first step with a conformity above about 75%.

* * * * *